(12) United States Patent
Isaac et al.

(10) Patent No.: US 9,159,396 B2
(45) Date of Patent: Oct. 13, 2015

(54) MECHANISM FOR FACILITATING FINE-GRAINED SELF-REFRESH CONTROL FOR DYNAMIC MEMORY DEVICES

(75) Inventors: Roger Isaac, San Jose, CA (US); Alan Ruberg, Menlo Park, CA (US)

(73) Assignee: Lattice Semiconductor Corporation, Portland, OR (US)

(*) Notice: Subject to any disclaimer, the term of this patent is extended or adjusted under 35 U.S.C. 154(b) by 801 days.

(21) Appl. No.: 13/173,302

(22) Filed: Jun. 30, 2011

(65) Prior Publication Data

US 2013/0007357 A1    Jan. 3, 2013

(51) Int. Cl.
*G06F 12/00* (2006.01)
*G11C 11/406* (2006.01)

(52) U.S. Cl.
CPC .... *G11C 11/40615* (2013.01); *G11C 11/40618* (2013.01); *G11C 2211/4061* (2013.01)

(58) Field of Classification Search
CPC .................................................... G06F 1/3275
USPC ........................................................ 711/106
See application file for complete search history.

(56) References Cited

U.S. PATENT DOCUMENTS

| | | | |
|---|---|---|---|
| 5,677,867 A * | 10/1997 | Hazani ................. | 365/185.01 |
| 6,269,039 B1 * | 7/2001 | Glossner et al. ......... | 365/210.1 |
| 6,778,457 B1 * | 8/2004 | Burgan ................... | 365/222 |
| 7,177,220 B2 * | 2/2007 | Chou et al. ............. | 365/222 |
| 7,193,918 B2 * | 3/2007 | Harrand et al. ......... | 365/222 |
| 8,400,859 B2 * | 3/2013 | Pelley et al. ............ | 365/222 |
| 2002/0136075 A1 * | 9/2002 | Chen Hsu et al. ...... | 365/222 |
| 2002/0191467 A1 | 12/2002 | Matsumoto et al. | |
| 2003/0012066 A1 * | 1/2003 | Poechmueller ........ | 365/200 |
| 2004/0160838 A1 | 8/2004 | Pelley et al. | |
| 2005/0071543 A1 | 3/2005 | Ellis et al. | |
| 2006/0203590 A1 | 9/2006 | Mori et al. | |
| 2007/0268767 A1 | 11/2007 | Kim | |
| 2009/0161459 A1 * | 6/2009 | Kohler et al. .......... | 365/201 |
| 2012/0243299 A1 * | 9/2012 | Shau ....................... | 365/149 |

FOREIGN PATENT DOCUMENTS

EP    1876602 A1    1/2008
WO    WO 02/058072 A2    7/2002

OTHER PUBLICATIONS

European Extended Search Report, European Application No. 12804749.5, Feb. 18, 2015, 6 pages.
PCT International Search Report and Written Opinion, PCT Application No. PCT/US2012/043727, Jan. 17, 2013, 8 pages.

* cited by examiner

*Primary Examiner* — Larry Mackall
(74) *Attorney, Agent, or Firm* — Fenwick & West LLP (57) ABSTRACT

A mechanism for facilitating improved refresh schemes for memory devices is described. In one embodiment, an apparatus includes a memory device having refresh logic and memory cells, the memory cells including data cells and supplemental cells, the supplemental cells to be observed. The supplemental cells emulate a decay characteristic of the data cells performing regular refresh operations according to an existing refresh policy. The apparatus may further include the refresh logic to receive, from the supplemental cells, observation data relating to decaying of the supplemental cells, and correlate the observation data to data cell performance. The refresh logic to generate a policy recommendation based on the observation data collected by the supplemental cells.

23 Claims, 8 Drawing Sheets

MECHANISM FOR FACILITATING FINE-GRAINED SELF-REFRESH CONTROL FOR DYNAMIC MEMORY DEVICES

TECHNICAL FIELD

Embodiments of the invention generally relate to the field of memory devices and, more particularly, to a mechanism for facilitating fine-grained refresh control for dynamic memory devices.

BACKGROUND

Memory devices are typically used for storing data and are essential for any computing system. With the rise in mobile computing devices (e.g., smartphones, Personal Digital Assistants (PDAs), pocket computers, tablet computers, etc.), it is preferred to have small memory devices that can hold large amounts of data. Several techniques have been introduced to make memory devices smaller with increased storing capability. One such memory device is a Dynamic Random Access Memory (DRAM) device.

A DRAM device (or simply "DRAM") is often employed for its architectural simplicity; for example, DRAMs employ extremely small capacitors such that billions of them can fit on a single memory chip. DRAM is volatile memory, meaning that it quickly loses its data when power is removed. Also, since a DRAM stores each bit of data in a separate capacitor within an integrated circuit, each capacitor can be charged or discharged. These two steps of charging and discharging represent the two values of a bit, which are typically known as 0 and 1. Since capacitors are known for leaking charge, the stored data eventually fades unless the capacitor charge is refreshed periodically. It is this periodic refresh requirement for DRAMs that the word "dynamic" of DRAM refers to as opposed to the word "static" in Static RAM (SRAM).

Current DRAM devices use refresh operations to maintain the state of each cell of memory over time. A DRAM cell programmed to "1" will decay over time and eventually be unable to distinguish between a one and a zero. In order to ensure that cells maintain their value, the frequency of refresh operations needs to be higher than the decay time. For example, the frequency of refresh operations need be high enough to ensure that any cell has a probability of error of less than $10^{-18}$. Complicating matters, cell decay is temperature-dependent and for each 10 degrees Celcius of temperature increase, the average decay time for a cell reduces by half. Even worse, future memory devices may be placed directly above a System-on-a-Chip (SoC), which can result in different parts of the DRAM device being exposed to different temperatures. A conventional system for determining decay uses a single temperature sensor that may be inaccurate and/or far from the 'hot spot' on the DRAM device. Using this single temperature sensor requires a highly conservative policy that takes the worst-case temperature into account and causes the DRAM to be refreshed at the worst-case rate. This results in higher power consumption, less available bandwidth, and remains far from the optimal refresh rate.

Figure 2A:
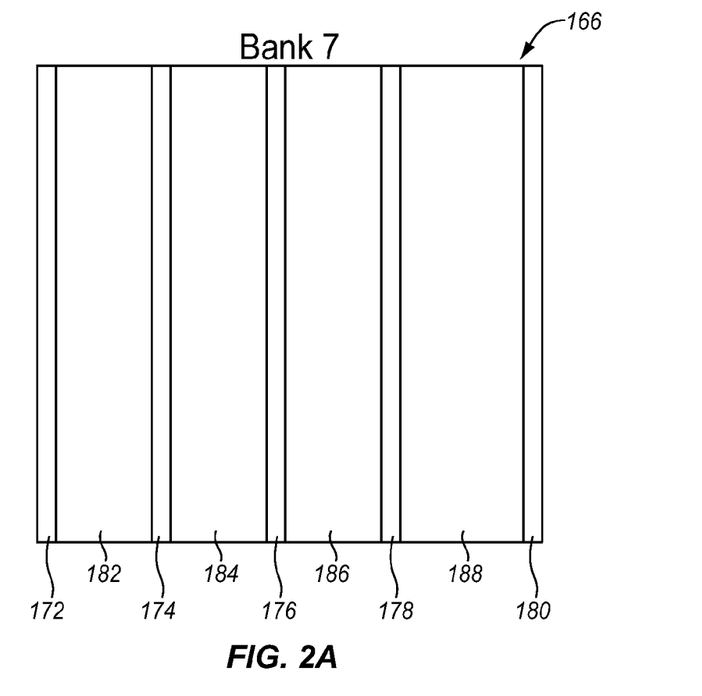
FIG. 2A illustrates a bank of FIG. 1 according to one embodiment of the invention.
Figure 2B:
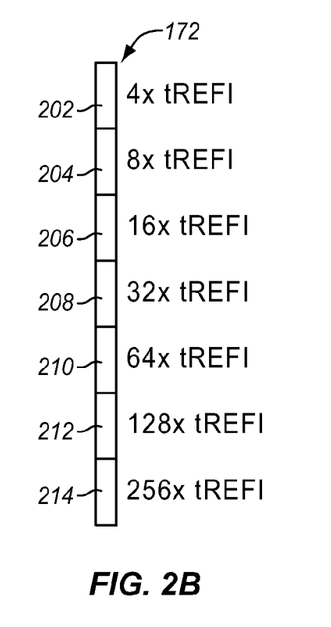
FIG. 2B illustrates breaking down of supplemental cells of a bank of FIG. 1 into cell subsets to perform sampling operations at various intervals onto the supplemental cells according to one embodiment of the invention.
Figure 2C:
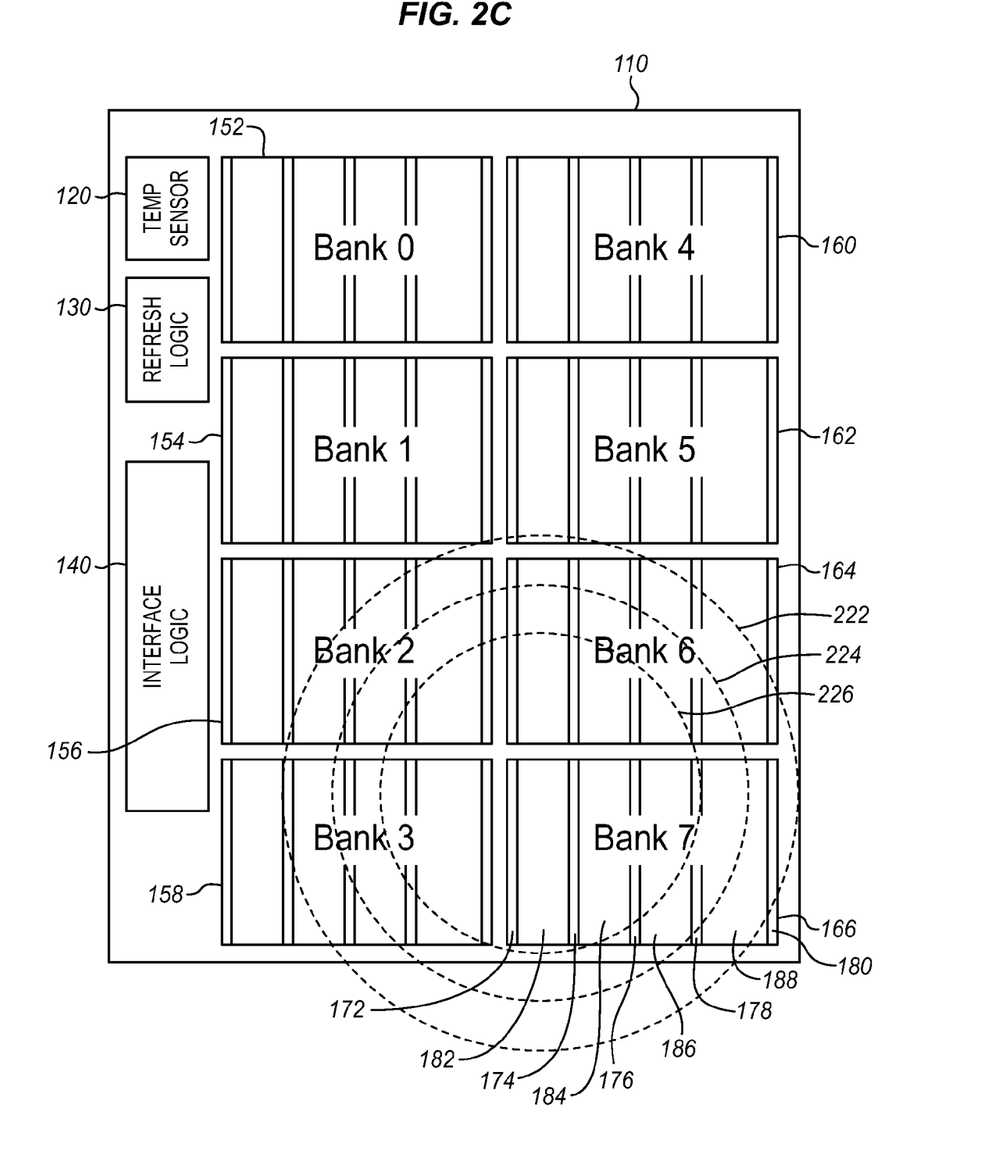
FIG. 2C illustrates an enhanced DRAM having supplemental cells to determine localized refresh policy according to one embodiment of the invention.
Figure 2D:
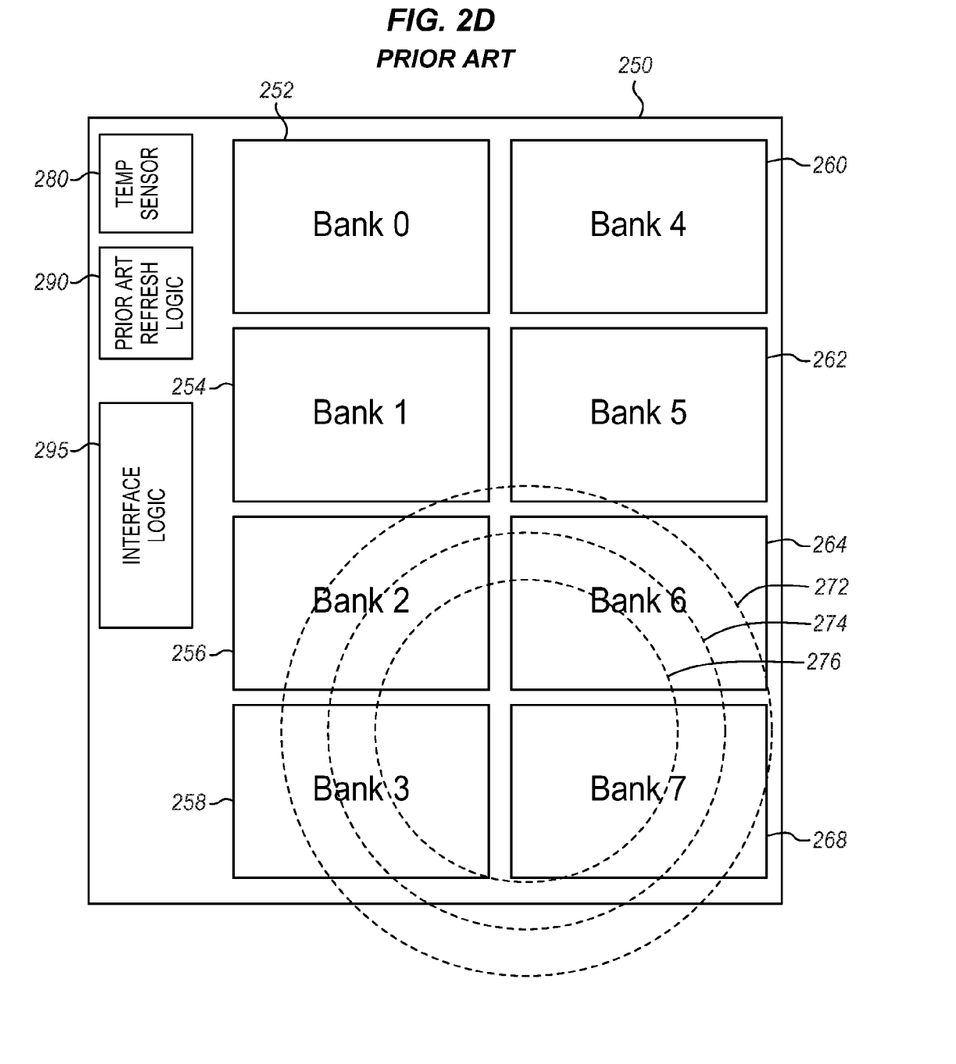
FIG. 2D illustrates a prior art scheme employing a conventional temperature sensor.

According to one conventional technique, as illustrated in prior art FIG. 2D, a temperature sensor is placed on a memory array of a DRAM device and a temperature sensor readout is then used to determine the refresh policy for the entire array. There are severe limtiations with this approach. For example, the temperature sensor readout can be inaccurate due to process variation, placement of the sensor within the array, or limitations of the temperature sensor design (e.g., quantization, etc.). In addition, a DRAM takes the worst case (temperature) scenario in account when determining a refresh policy. Thus, with a temperature sensor with an accuracy of +/−5 degrees Celsius and a maximum temperature gradient of 5 degrees Celsius across the memory array, the refresh policy must take into account the possibility of a total of 10 degrees Celsius difference between the temperature readout and any given cell in the memory array. This results in an overly conservative approach for refresh operations and also, increases the amount of power that the system consumes to perform the refresh policy, and limits the available system bandwidth because the memory array is unavailable during refresh periods. Additionally, heating caused by excessive refresh operations exacerbates the problem.

Furthermore, an increase in the density of a DRAM device causes an increase in the number of refresh operations for that device. Consequently, using conventional refresh schemes, future DRAMs may require up to 25% of the DRAM bandwidth to be dedicated to refresh operations due to density and temperature increases. According to certain data reports, with the increase in DRAM density and temperature, the bandwidth utilization of refresh operations can grow from the best case scenario of 3% to the worst case senario of 86%.

SUMMARY

A mechanism for facilitating improved refresh schemes for memory devices is described.

In one embodiment, an apparatus includes a memory device having refresh logic and memory cells. The memory cells include data cells and supplemental cells. The data cells are refreshed normally at a frequency according to an existing policy under present conditions. The supplemental cells are sampled at a number of lower frequencies than the data cells and the supplemental cell values are observed for determining data cell data retention. Based on the observation data received from the supplemental cells, the refresh logic generates a policy recommendation based on the observation data collected by the supplemental cells.

In one embodiment, a system includes a processor coupled to a memory device. The processor includes refresh logic and the memory device includes refresh logic and memory cells that include data cells and supplemental cells and possibly further refresh logic. The supplemental cells on which are performed sample operations at a lower frequency than data cell refresh operations. The processor and/or memory refresh logic to receive, from the supplemental cells, observation data relating to the ability of data cells retaining data under different conditions. The processor and/or memory refresh logic to generate a policy recommendation based on the observation data collected by the supplemental cells.

In one embodiment, a method includes performing, via data cells of a memory device, regular refresh operations according to an existing refresh policy. The memory device further includes supplemental cells. The method may further include observing the supplemental cells, then performing refresh operations according to the state of the supplemental cells. The method may further include receiving, at refresh logic, observation data relating to the observation of the supplemental cells, and generating, via the refresh logic, a policy recommendation based on the observation data collected by the supplemental cells.

In one embodiment, an apparatus includes a memory device having refresh logic and memory cells, the memory cells including data cells and supplemental cells, the supplemental cells to be observed. The supplemental cells emulate a decay characteristic of the data cells performing regular refresh operations according to an existing refresh policy. The apparatus may further include the refresh logic to receive, from the supplemental cells, observation data relating to decaying of the supplemental cells, and correlate the observation data to data cell performance. The refresh logic to generate a policy recommendation based on the observation data collected by the supplemental cells.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to facilitating fine-grained refresh (e.g., self-refresh or controller-based refresh) control for memory devices.

Embodiments of the invention provide for optimal refresh rates to refresh memory cells in memory devices before they can lose their charge. Embodiments of the invention determine a nearly optimal refresh rate for a memory device (e.g., DRAM) by measuring the decay rate of actual cells proximate to different areas used for actual storage within the memory array. This, in-turn, lowers the overall power consumption of the memory device, while increasing its available bandwidth. Embodiments of the invention cover a wide range of scenarios for future memory devices and systems. For example, density increases in DRAM devices may require corresponding increases in the number of refresh operations for the devices. Using embodiments of the invention, such refresh increases can be controlled and eliminated, saving a large amount of device bandwidth that would have otherwise been dedicated to increased refresh operations. In one embodiment, a more accurate and efficient system is provided for controlling refresh operations so that significant bandwidth can be freed up, while reducing power consumption.

Figure 1:
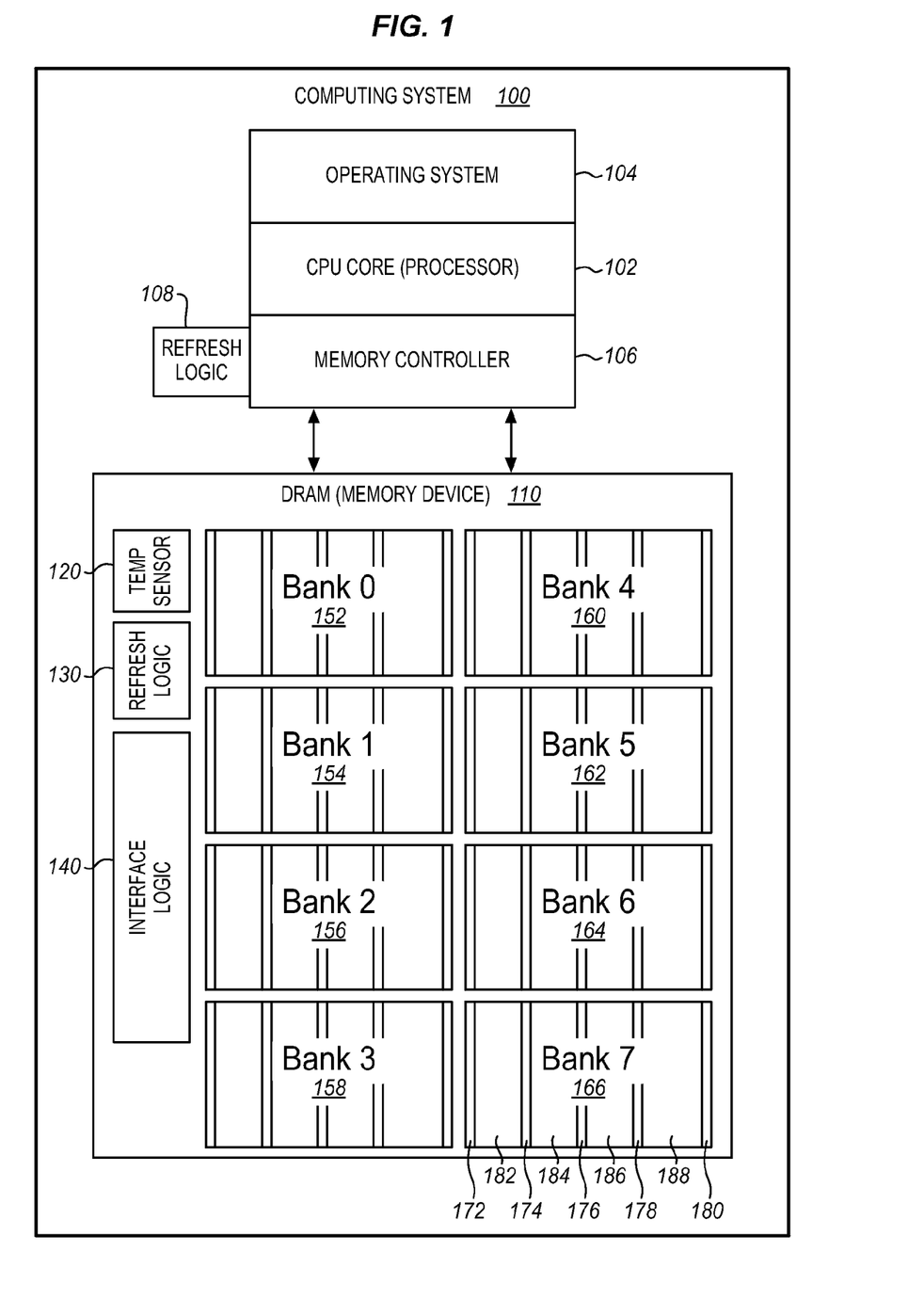
FIG. 1 illustrates a computing system having a DRAM memory device according to one embodiment of the invention.

FIG. 1 illustrates a computing system having a DRAM memory device according to one embodiment of the invention. Computing system 100 is illustrated to include a Central Processing Unit (CPU) core 102 represents one or more processors connected to one or more memory controllers 106. Computing system 100 further includes an operating system 104 and a DRAM memory device 110 controlled by memory controller 106. DRAM 110 is shown to have a temperature sensor 120, refresh logic 130, interface logic 140, and a number of memory banks 0-7 152-166. Temperature sensor 120 is used to sense the temperature (e.g., in degrees Celsius) to perform or trigger various tasks (e.g., a refresh operation). Interface logic 140 is used to provide an interface between the DRAM 110 and other components of the computing system 100. For example, memory controller 106 may not have direct access to the DRAM 110, but the memory controller 106 may access and communicate with the DRAM through the interface logic 140.

Furthermore, according to one embodiment, refresh logic 108 as part of memory controller 106 may control DRAM refresh operations similar to refresh logic 130 as a component of the DRAM 110, albeit through interface logic 140. For example, refresh logic 108 may differ from refresh logic 130 in location but both refresh logic 108, 130 (regardless of whether both are or one of the them is used) provide the same novel functionalities as described throughout this document. In one embodiment, the two refresh logics 108, 130 may provide two different refresh policies based on their analysis of the data and performing other relevant functionalities and operations.

In one embodiment, a number of supplemental memory cells are introduced to and employed in each bank 152-166, such as, as illustrated, bank 7 166 having additional or supplemental memory cells 172-180 to generate the enhanced DRAM ("enhanced DRAM", "DRAM device", "DRAM memory device" or simply "DRAM") 110. Although not illustrated here, all or any number of banks 152-166 may contain a set of supplemental cells to determine appropriate localized refresh operation policy. As illustrated with respect to bank 7 166, in one embodiment, supplemental cells 172-180 may be scattered throughout the regular memory cell 182-188 of the bank 166, as desired or necessitated. In this illustration, supplemental cells 172-180 are shown as columns or strips in between columns of regular memory cells 182-188 of bank 7 166. In some embodiments, the additional cells may be scattered in another pattern or without any pattern whatsoever or be simply placed in a single particular spot within the bank 152-166, as desired or necessitated. Although bank 7 166 and its data cells 182-188 and supplemental cells 172-180 are shown here for simplicity and brevity, it is contemplated that any number of banks 152-166 can contain any number of regular and supplemental cells in any form or pattern. Further, each bar of data cells 182-188 is also referred to as a data cell column and similarly, each bar of supplemental cells 172-180 is also referred to as a supplemental cell column.

In one embodiment, supplemental cells 172-180 are placed among data cells 182-188 of bank 7 166 to serve as sample cells that closely resemble the behavior of data cells 182-188 due to proximity. For example, supplemental cells 172-180 perform sampling operations at a lower frequency, according to an existing refresh policy, and, according to the supplemental cell state, report decay data to the refresh logics 130, 108 that is very close to the decay characteristic of the data cells 182-188. Refresh logics 130, 108 may use the state of the supplemental cells to amend refresh policies. In one embodiment, the refresh logics 130, 108 control the sampling frequency of the supplemental cells 172-180 in order to observe the appropriateness of regular refresh operations being performed on the data cells 182-188. Supplemental cells 172-180 report back their observation findings to the refresh logics 130, 108. For example, the observation findings may indicate that the too many or too few refresh operations are being performed on the data cells 182-188 of bank 7 166. Refresh logics 130, 108 may then analyze these observation findings and prepare and provide a refresh policy recommendation to determine that future refresh operation increases or decreases regular refresh operations, changing the frequency of or the amount of time between regular refresh operations.

It is contemplated that the refresh logic 130 may simply adjust the frequency depending on the location of the transition between good samples and bad samples. Further, in one embodiment, the refresh logic 130 may be used during self-refresh operations when the DRAM 110 is powered down and during this time, the refresh logic 130 may invoke a refresh operation, observe the supplemental cells 172-180 (at a lower frequency), and adjust its own refresh frequency. The memory controller 106, on the other hand and in one embodiment, may perform a read operation on the supplemental cells 172-180 directly, such as in refresh logic block 108, and internally derive its own policy (with or without any recommendations from the refresh logic 130). Further, each block 152-166 may independently determine its own policy.

FIG. 2A illustrates a bank of FIG. 1 according to one embodiment of the invention. In one embodiment, bank 7 166 is shown as having regular memory cells 182-188 interlaced or alternated with supplemental cells 172-180 that are used to determine localized refresh operation effectiveness. In one embodiment, as described with reference to FIG. 1, supplemental cells 172-180 work with refresh logic of the enhanced DRAM to monitor the refresh performance of the data cells 182-188 performing regular refresh operations. In one embodiment, the supplemental cells 172-180 measure proximate cell performance by measuring various cell subsets at various intervals as will be further described with reference to FIG. 2B. The various times of sampling may be simply periodic (e.g. every millisecond), or based on temperature (e.g., every few degrees Celsius ambient), occurrence of an act (e.g., upon detecting an unusually high CPU load), or any other predetermined criteria (e.g., any combination of temperature and time), etc., and may be applied to any one or several or all of the supplemental cells 172-180.

FIG. 2B illustrates breaking down of supplemental cells of a bank of FIG. 1 into cell subsets that are monitored at various periodic intervals according to one embodiment of the invention. In the illustrated embodiment, for brevity and clarity, a single supplemental cell column 172 out of several supplemental cell columns 172-180 of bank 7 166 is shown to have been further divided into supplemental cell subsets 202-214. Each cell subset, such as cell subset 202, may contain a number of cells and is used to monitor cell performance at a single periodic time interval that is different from those of other subsets, such as subsets 204-214. For example, as illustrated, cell subset 202 may be sampled at an interval of tREFI*4 while each of the other cell subsets 204-214 may be sampled at a different (in this case, longer) intervals (e.g., tREFI*8, tREFI*16, tREFI*32, tREFI*64, tREFI*128, tREFI*256). It is contemplated that other ways of arranging supplemental cells (e.g., interleaving with data cells) may be employed.

Referring back to FIG. 2A, in one embodiment, a novel technique for determining refresh intervals for regular DRAM memory cell arrays or columns 182-188 using supplemental cells 172-180 is described. Instead of just using a temperature sensor, as is the case with the prior art conventional techniques, in one embodiment, columns of supplemental cells 172-180 are used to work with the refresh logic to observe the existing regular refresh performance for data cell columns 182-188 in order to determine whether any changes to be made to the existing refresh policy (according to which the refresh operations are performed). In one embodiment, as shown in FIG. 2B, each supplemental cell column 172 may be divided into multiple subsets of cells 202-214 to be sampled at various intervals. For example, as aforementioned and illustrated, a supplemental cell subset 202 may be sampled at an interval of tREFI*4, while other cell subsets 204-214 are sampled at a much longer interval, such as ranging from tREFI*8 to tREFI*256, within the same supplemental cell column 172. By sampling certain subsets of cells at lower (or higher) rates than others, the cell decay distribution function across cell subsets 202-214 can be derived and the appropriate tREFI can be determined for each subset of data cells (e.g. 182). Having a number of cell subsets 202-214 helps deal with various temperature gradients at a fine-grained level of individual regular memory columns, e.g. 182 as well as cell subsets 202-214. This fine-grained information may then be used to determine whether the existing refresh policy that regulates the regular refresh operations of the data cell columns is appropriate or need be amended.

In one embodiment, supplemental cell columns 172-180 may be set to a value of "HIGH" initially and then sampled at differing intervals for each of the cell subsets 202-214 of each of the supplemental columns 172. When each cell subset 202-214 is sampled, any error values (e.g., "LOW") would be detected and used to determine the appropriate tREFI for regular memory segments 182-188. Using this information, supplemental cell columns 172-180 work with the refresh logic that determines a policy that could be set for the enhanced DRAM as to which refresh window level errors would be acceptable (e.g., "tREFI*8", "tREFI*16", etc.). If, for example, an error is detected in a lower value refresh window, then tREFI is decreased. Similarly, a refresh policy is generated for the enhanced DRAM to determine at which level no errors are detected or observed so that it is acceptable to increase the tREFI setting for the given segment ("tREFI*32", "tREFI*64", etc.) or keep it unchanged. In this embodiment, the sampled supplemental cells are reset to '1' as part of the sampling process to prepare for the next sample cycle.

It is contemplated that in some embodiments, supplemental cell columns 172-180 may not be divided into cell subsets and that an entire supplemental cell column, such as supplemental cell columns 172-180 of bank 7 166, may be used to perform and observe refresh effectiveness at various intervals. As with cell subsets 202-214, different sampling operations may be performed and observed at a supplemental cell column level, such as performed and observed at a different interval by each supplemental cell column 174-180 of each bank, such as bank 7 166, as opposed to each cell subset 202-214 of each supplemental cell column, such as supplemental cell column 172.

Now referring to FIG. 2C illustrating an enhanced DRAM having supplemental cells to determine localized refresh effectiveness according to one embodiment of the invention is illustrated. In the illustrated embodiment, the enhanced DRAM 110 includes a number of banks 152-166 with each having data cells and supplemental cells. As with FIG. 1, for brevity and ease of understanding, only bank 7 166 is shown to have "numbered" data cells 182-188 and supplemental cells 172-180, but it is contemplated that an enhanced DRAM 110 can have any number of banks 0-7 152-166 and that each bank 0-7 152-166 can have any number of regular and supplemental cells. Having supplemental cells 172-180 makes a regular DRAM an enhanced DRAM 110 and allows for a localized refresh policy when the enhanced DRAM 110 experiences various heat gradients 222-226. For example, supplemental cells 172-180 (and their subset cells, such as subset cells 202-214 of the supplemental cell column 176) are used to determine the localized refresh policy having each subset cell, such as subset cells 202-214, of each supplemental cell column, such as supplemental cell column 172, of each bank, such as bank 7 166, test the different heat gradients 222-226 and test multiple refresh intervals for each subset cell 202-214, across the DRAM 110, and its corresponding heat gradients 222-226. In one embodiment, data cells 182-188 may be refreshed at intervals of tREFI, while supplemental cells 172-180 may be sampled at intervals different from tREFI. This novel technique is used by supplemental cells 172-180 to formalize the effect of localized heating and provide information about it to the refresh logic to form a relevant refresh policy. This technique of employing various tREFIs that are localized (hence, customized) within smaller sections of the enhanced DRAM 110 is clearly advantageous over conventional techniques of employing a single conservative tREFI for the entire memory chip and this conventional single tREFI is unable to localize and is not capable of taking into account the various and changing heat gradients across the memory chip. In this case, for example, customized refresh intervals are used because the data cells 182-188 have different refresh rates in their region.

In an embodiment, accuracy can be improved by performing a calibration process to compare supplemental cell performance with data cell performance. At times, when data cells are unused (e.g., have no pertinent data stored in them, such as at startup), the data cells can be sampled similarly to supplemental cells, and the results compared. The difference between the actual data cell results and the supplemental cell results can be used to refine the supplemental cell information while developing a policy.

FIG. 2D illustrates a conventional technique reflecting a current scheme employing only a conventional temperature sensor 280 that is used to derive a single conservative tREFI that is used for the entire DRAM memory chip 250 which cannot not take into account the various heat segments or gradients 272-276 across the DRAM 250 and thus, the single tREFI is required to take into account the maximum heat gradient 272 possible across the DRAM 250. The prior art refresh logic 290 (along with the conventional interface logic 295) is incapable of recognizing the various heat segments 272-276 and is required to consider and act according to the maximum heat gradient 272.

Figure 3:
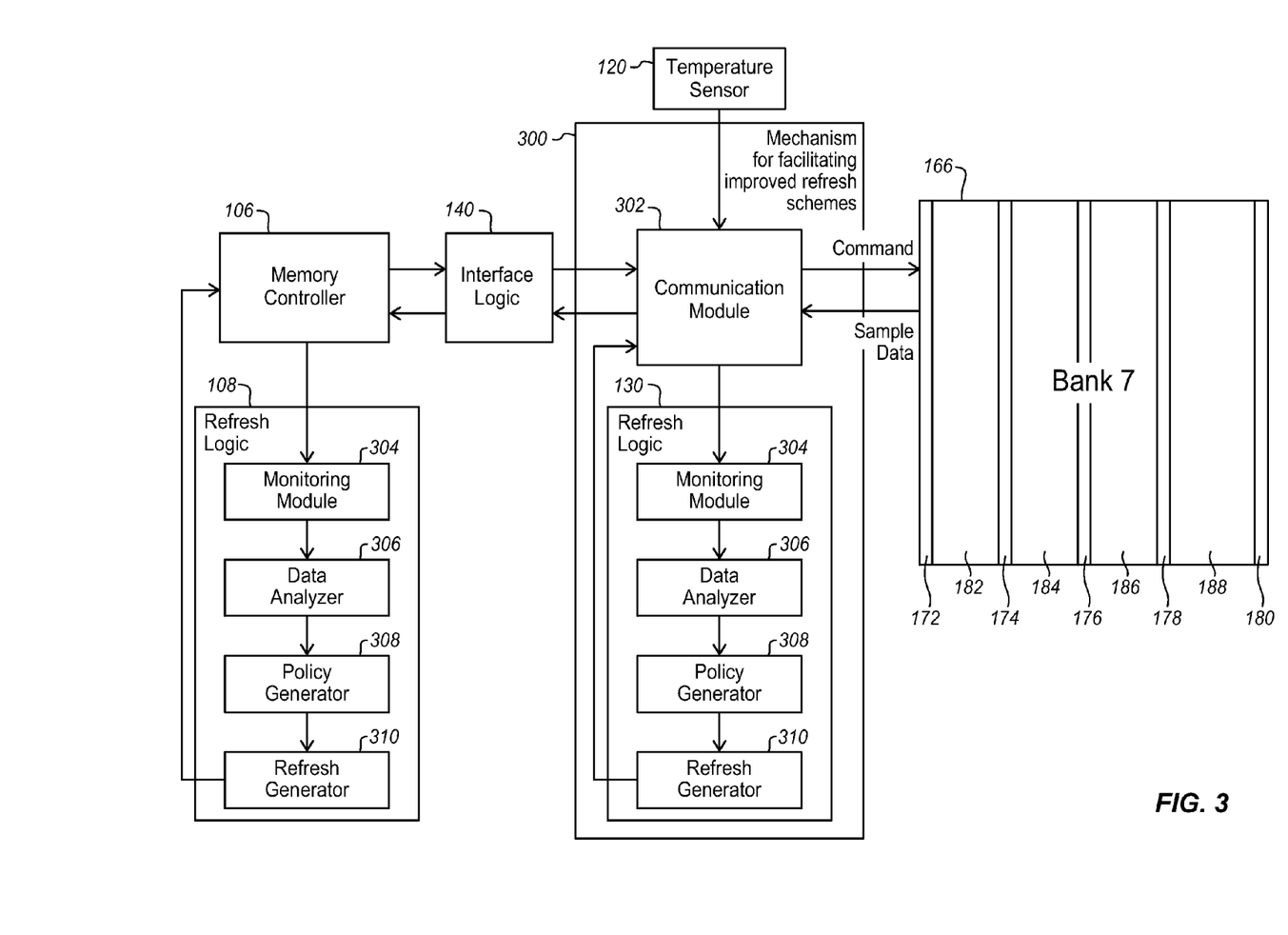
FIG. 3 illustrates a DRAM bank in communication with refresh logic having a mechanism for facilitating improved refresh schemes according to one embodiment of the invention.

FIG. 3 illustrates a DRAM bank in communication with a refresh logic having a mechanism for facilitating improved refresh schemes according to one embodiment of the invention. In one embodiment, refresh logics 130, 108 include a number of components 304-310 to manage supplemental cells 172-180 and data cells 182-188 of banks 166 of DRAM 110. This managing of regular and supplemental cells 182-188, 172-180 includes numerous acts, including executing the existing refresh policy to the data cells 182-188, sampling and providing observation support to the supplemental cells 172-180, receiving observation findings or data from the supplemental cells 172-180, analyzing the observation data, generating a refresh policy providing policy recommendations for future refresh operations. The components 304-310 of the refresh logics 130, 108 may be software, hardware, or any combination thereof (e.g., firmware). In one embodiment, the management of supplemental and data cells 172-180, 182-188 by the refresh logics 130, 108 includes monitoring and analyzing the effectiveness of the existing refresh policy-based refresh operations being performed at the DRAM 110 and preparing more efficient refresh operation policies or schemes. In one embodiment, for example, a combination of the refresh logics 130, 108 and supplemental cells, such as supplemental cells 172-180, may be used to determine an optimal refresh policy for the DRAM 110 for various temperature values and at various temperature gradients. Further, a temperature sensor 120 is used in combination with the supplemental cells 172-180 and the observation data obtained from these supplemental cells 172-180 to further help the refresh logics 130, 108 in generating optimal and dynamic refresh operations policies.

Since the memory controller 106 is not likely to have direct access to the DRAM 166, in one embodiment, the refresh logic 130 may be in communication with a memory controller 106, such as via interface logic 140 to promote its agenda and perform its tasks. Furthermore, refresh logic 108, as part of memory controller 106, may perform or participate in or employ a mechanism for improved refresh schemes ("mechanism") 300. In this embodiment, explicit activate, auto-refresh, or policy setting commands, among others, are issued by the memory controller 106 instead of using an in-memory self-refresh component. In one embodiment, in lieu of or in addition to enhancing the DRAM 166, the memory controller 106 may reserve certain memory data cells within the array (e.g., from cells 182-188) for use as supplemental cells 172-180 for observation purposes and may access such memory cells at extended intervals. The memory controller 106 may then adjust its refresh policy, accordingly. This novel technique provides an additional benefit of not requiring any enhancement to a memory part to take advantage of the embodiments of the invention.

In one embodiment, supplemental cells 172-180 are allocated from cells built into the memory but are unusable because they were to be used as redundant data cells to be substituted for defects, or they may be defective (but in ways that do not inhibit their use for observation) and have been taken out of service as data cells. This has the benefit of keeping the entire addressable memory space available for data cell use. Instead of using purpose-built supplement cells 172-180, the incremental cost of the DRAM 110 with this function can be kept hidden.

In one embodiment, the mechanism 300 includes a communication module 302 to facilitate bi-directional communication between the refresh logics 130, 108 and supplemental cells employed at the DRAM 110, such as the supplemental cells 172-180 employed at bank 7 166 of the DRAM 110. For example, the communication module 302 may be used to transmit refresh commands and other instructions from the refresh logic 130 (or memory controller 106 using refresh logic 108 through interface logic 140) to the supplemental and data cells 172-180, 182-188 and receive refresh operation findings or data from the supplemental cells 172-180. In one embodiment, the refresh logics 130, 108 further include a monitoring module 304 that directs the supplemental cells 172-180 (and their cell subsets, if any) to perform sampling operations according to certain instructions including an existing refresh policy provided by the policy generator 308 to observe with finer granularity the heat gradients and the corresponding refresh operations.

In one embodiment, the supplemental cells 172-180 perform the sampling operations to determine the effectiveness of existing refresh policies and whether they need be changed. For example, as aforementioned with reference to FIG. 2B, one or more columns of the supplemental cells 172-180 may be divided into a number of cell subsets where each cell subset may be set to perform a sampling operation at a particular refresh interval (e.g., tREFI*4, tREFI*8, etc.). These supplemental cells 172-180 may then collect the relevant data regarding the existing refresh policy in relation to the current refresh interval tREFI, for example, in terms of how the supplemental cells 172-180 respond to it and whether the existing policy benefits or disadvantages the DRAM 110. The collected sample data is then provided to the refresh logics 130, 108 via the communication module 302.

The refresh logics 130, 108 further include a data analyzer 306 to analyze the sample operation data received from the supplemental cells 172-180. Data analyzer 306 considers various factors and variables (e.g., whether the computing system is performing video, graphics, networking, etc.) affecting refresh operations and analyzes the supplemental sample findings in light of these factors and variables and determines whether any changes are to be made to the refresh policy. For example, if the number of refresh operations is to be limited to achieve the optimal refresh scheme, the data analyzer 306 provides that information to a policy generator 308 of the refresh logics 130, 108. The policy generator 308 receives the information and generates a refresh policy that is executed by refresh generator 310.

The refresh generator 310 of refresh logics 130, 108 performs self-refresh and/or auto refresh (or other style of refresh) operations on the data cells 182-188 in banks of DRAM 110. In one embodiment, the refresh generator issues refresh commands at periodic intervals tREFI. Other embodiments may issue refresh commands at differing times; e.g. depending on memory cell availability.

In one embodiment, when the memory controller 106 is controlling refresh policy (e.g. when memory is actively used for computing), a controller-based refresh logic 108 with similar functions as in-memory refresh logic 130 is used. Memory controller refresh logic 108 may implement logic blocks 304-310 differently, with goals more suitable for use by memory controller 106. In particular, it is likely that the policy implemented in refresh logic 108 be different than the (e.g. simpler) one in refresh logic 130.

It is contemplated that the illustrated bank 166 and its regular and supplemental cells 182-188 are shown merely as an example for brevity, clarity and ease of understanding and that the embodiments of the limitations are not limited to this single bank 166 nor to the number, types, or placement of these cells 172-188 within the DRAM 101 and that the embodiments are applicable to and workable with any number and types and architecture of memory devices and their memory cells and refresh policies.

Figure 4:
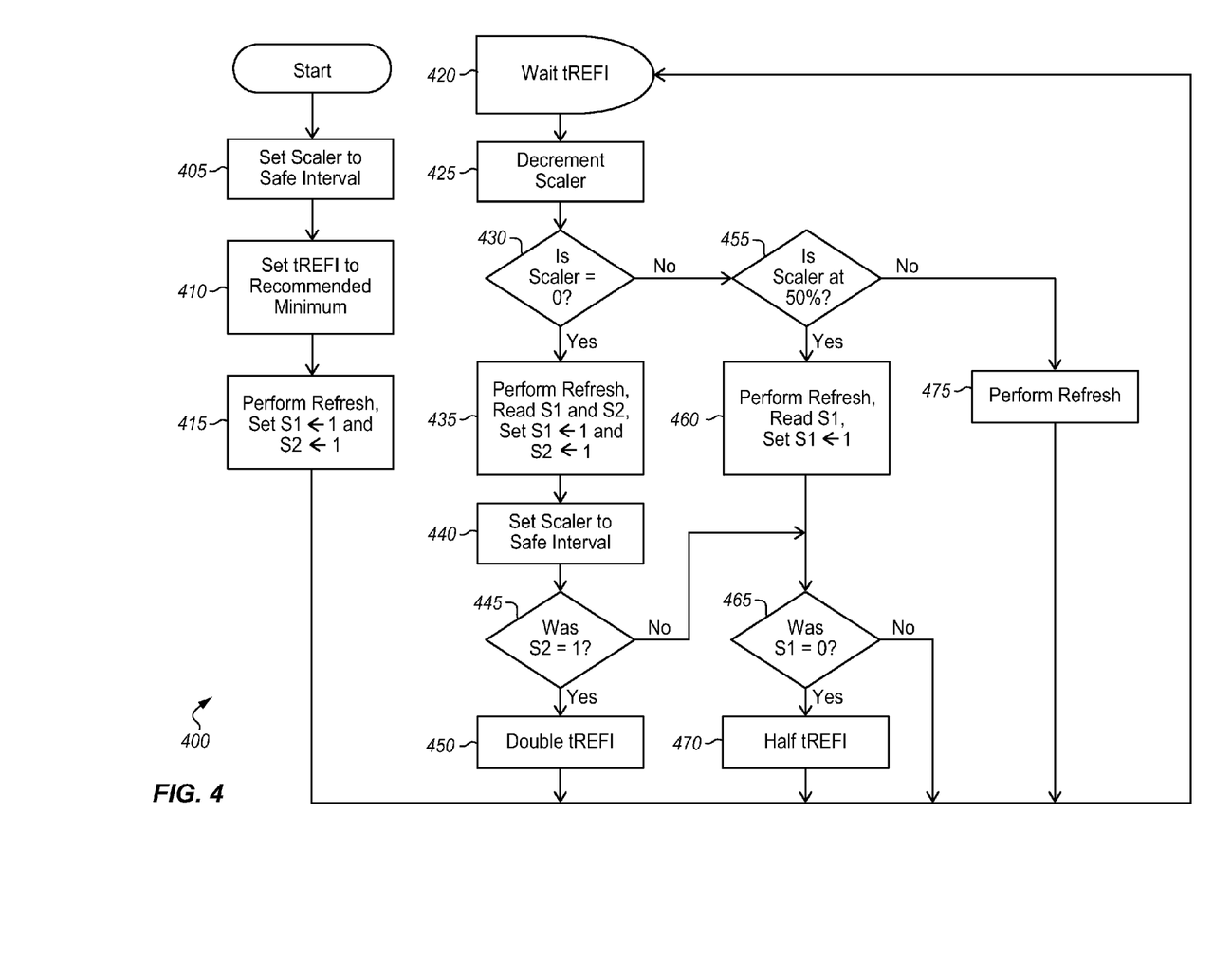
FIG. 4 illustrates a method for facilitating improved refresh schemes according to one embodiment of the invention.

FIG. 4 illustrates a method for facilitating improved refresh schemes according to one embodiment of the invention. Method 400 may be performed by processing logic that may comprise hardware (e.g., circuitry, dedicated logic, programmable logic, microcode, etc.), software (such as instructions run on a processing device), or a combination thereof, such as firmware or functional circuitry within hardware devices. In one embodiment, method 400 is performed by the mechanism for facilitating improved refresh schemes employed by the refresh logics 130, 108 using supplemental cells employed by the enhanced DRAM 110 such as illustrated in FIG. 3. In one embodiment, the refresh logics 130, 108 may be external to and away from the DRAM 110 or, in another embodiment, the refresh logics 130, 108 may be employed within or on the DRAM 110 or, in yet another embodiment, the refresh logics 130, 108 may be external but coupled to the DRAM 110.

To form an example, this embodiment presumes two supplemental cells in a refresh group, supplemental cell S2 being sampled half as fast (twice the time) as supplemental cell S1. A scaling counter ("scaler") is used to provide a safety margin longer than tREFI, the current refresh rate for data cells. For example, it might be desired to have the nominal refresh rate be 8 times faster than the fundamental decay rate (the point at which S1 becomes 0). Due to the exponential nature of cell decay and the convenience of working with powers of two in digital systems, a policy is demonstrated where S2 is sampled half as fast as S1 and when tREFI must change, it is varied by a factor of 2 (doubling or halving) to match.

Other embodiments may use any refresh rate for data cells, any supplemental sample interval, and any policy for changing the regular refresh rate. Likewise, other embodiments may choose to use more or less supplemental cells in a refresh group.

Method 400 begins at block 405 with the initialization of the scaler, which is set to a safe interval as compared to the refresh interval for data cells. At block 410, a minimum refresh time is applied to the tREFI interval, which (in this embodiment), is a time that is guaranteed to correctly refresh the cells under any operating condition. Finally, at block 415, the data cells in the refresh block are initially refreshed and the supplemental cells S1 and S2 are initialized to 1.

For all iterations, refresh operations are spaced by tREFI in block 420 and then the scaler is decremented by 1 at block 425. At blocks 430 and 455, if the scaler is not 0 or 50%, then a simple refresh operation 475 is performed.

Due to the regenerative nature of DRAM read and refresh operations, to reduce complexity, and to maintain similarity (proximity) of supplemental cells with data cells, this embodiment describes the desirability of refreshing the data cells while at the same time sampling the supplemental cells as at blocks 435 and 460. The supplemental cells need not be sampled at the same time, nor need they have a common circuit or timing relationship. As the supplemental cells are being sampled, they are also reset to 1 in preparation for the next sampling operation.

When, at block 430, the scaler is not 0, but it is at the 50% count at block 455, then the fast supplemental test is performed. The refresh and sampling operation for S1 is performed in block 460. In block 465, if S1 is 0, meaning that it had decayed, then the scaled refresh rate is insufficient, and tREFI is reduced at block 470 causing more refresh operations to be performed. S1 is reset to 1 (possibly re-generatively) in preparation for the next fast sampling operation.

When, at block 430, the scaler becomes 0, the slow supplemental test is performed. The refresh and sampling operation is performed in block 435 and the scaler is set to a safe interval at block 440. If S2, the supplemental cell that samples the slow rate is 1 in block 445, then too many refresh operations are being performed and the refresh interval is increased in block 450 to slow the refresh rate for data cells. S2 is reset to 1 (possibly re-generatively) in preparation for the next slow sampling operation. If S2 was not sampled as a 1 at block 445, meaning that its value had decayed, then S1 is tested in block 465 to ensure that the refresh rate is sufficient.

This embodiment settles to a point where S2 is 0 and S1 is 1. This means that the scaled refresh rate is sufficient, but not excessive. For example, when tREFI is set to the minimum interval at block 410, both S1 and S2 are likely to be 1 because the conditions are more favorable than the expected worst case. S2, the slow rate indicator, will be the first to decay, so the test at block 465 will always fail at this point. At each interval as prescribed by the scaler, S2 is tested at block 445 and tREFI is increased at block 450 until only the necessary number of normal refresh operations is performed as indicated by the decay of S2. At the end of this initial process, S2 is 0 and S1 is 1.

To avoid problems with system or memory defects where S1 can never be one, and exemplary systems where S2 can never be 0, or poor scaler selection, it would be prudent to place limits on the adjustment of tREFI. Processing of limits is not shown to emphasize the method of the invention.

Figure 5:
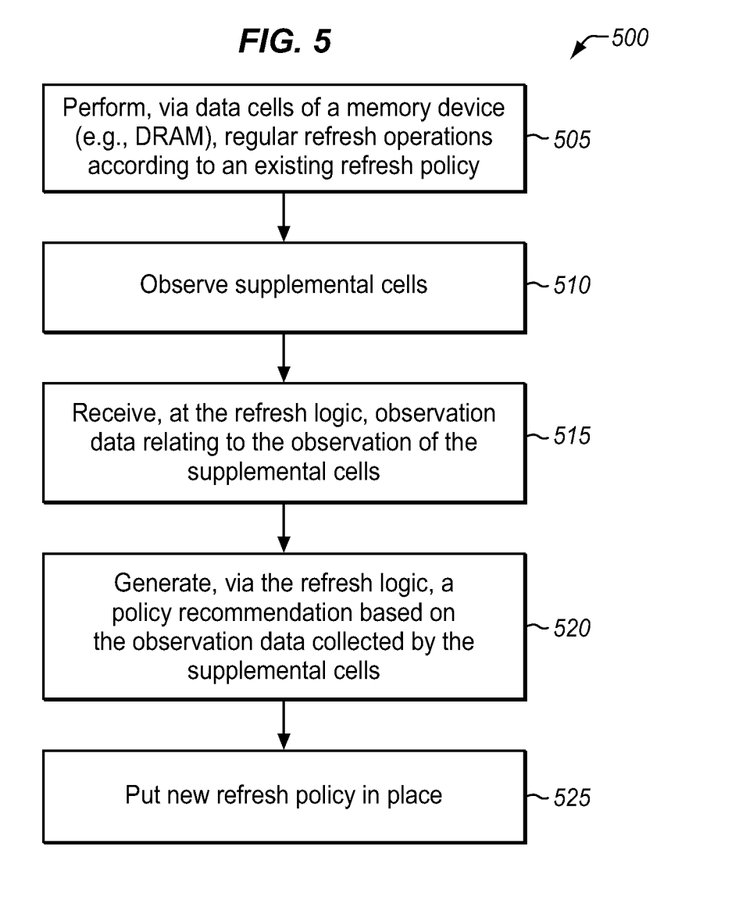
FIG. 5 illustrates a method for facilitating improved refresh schemes according to one embodiment of the invention.

FIG. 5 illustrates a method for facilitating improved refresh schemes according to one embodiment of the invention. Method 500 may be performed by processing logic that may comprise hardware (e.g., circuitry, dedicated logic, programmable logic, microcode, etc.), software (such as instructions run on a processing device), or a combination thereof, such as firmware or functional circuitry within hardware devices. In one embodiment, method 500 is performed by the mechanism for facilitating improved refresh schemes employed by the refresh logics 130, 108 using supplemental cells employed by the enhanced DRAM 110 such as illustrated in FIG. 3. In one embodiment, the refresh logics 130, 108 may be external to and away from the DRAM 110 or, in another embodiment, the refresh logics 130, 108 may be employed within or on the DRAM 110 or, in yet another embodiment, the refresh logics 130, 108 may be external but coupled to the DRAM 110.

Method 500 begins at block 505 with performing, via data cells of a memory device (e.g., DRAM), regular refresh operations according to an existing refresh policy. The memory device further includes supplemental cells. At block 510, supplemental cells are observed and reset to a known value for the next sampling operation. At block 515, observation data relating to the observation of the supplemental cells is received at the refresh logic. At block 520, a policy recommendation is generated using the refresh logic and based on the observation data collected by the supplemental cells. At 525, the policy recommendation is put into operation, possibly changing the frequency and style of refresh operations. The process returns to block 505 performing refreshes using the new policy.

Figure 6:
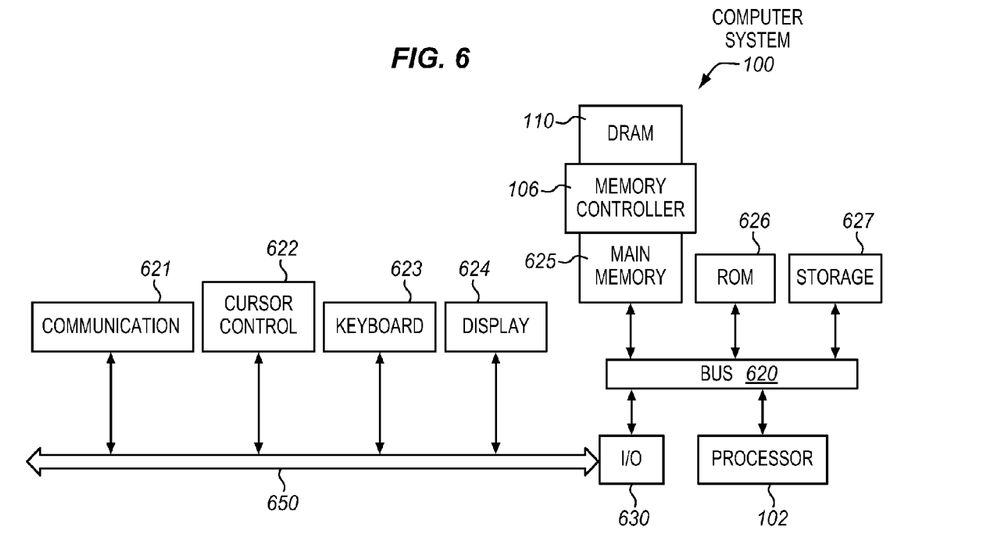
FIG. 6 illustrates a computer system according to one embodiment of the invention.

FIG. 6 illustrates a computer system 100 on which embodiments of the present invention may be implemented. Computer system 100 includes a system bus 620 for communicating information, and a processor 102 coupled to bus 620 for processing information. According to one embodiment, processor 102 is implemented using one of the multitudes of microprocessors. Nevertheless one of ordinary skill in the art will appreciate that other processors may be used. Computer system 100 employing DRAM 110 is further described in FIG. 1.

Computer system 100 further comprises a random access memory (RAM) or other dynamic storage device 625 (referred to herein as main memory), coupled to bus 620 for storing information and instructions to be executed by processor 102. Main memory 625 also may be used for storing temporary variables or other intermediate information during execution of instructions by processor 102. In one embodiment, part of the main memory 625 may be implemented using the enhanced DRAM 110 along with memory controller 106. Computer system 100 also may include a read only memory (ROM) and or other static storage device 626 coupled to bus 620 for storing static information and instructions used by processor 102.

A data storage device 625 such as a magnetic disk or optical disc and its corresponding drive may also be coupled to computer system 100 for storing information and instructions. Computer system 100 can also be coupled to a second input/output (I/O) bus 650 via an I/O interface 630. A plurality of I/O devices may be coupled to I/O bus 650, including a display device 624, an input device (e.g., an alphanumeric input device 623 and or a cursor control device 622). The communication device 621 is for accessing other computers (servers or clients) via external data network. The communication device 621 may comprise a modem, a network interface card, or other well-known interface device, such as those used for coupling to Ethernet, token ring, or other types of networks. Computer system 100 includes, but is not limited to, a network computer device, a mobile telephone, a personal data assistant (PDA), etc.

Computer system 100 may be interconnected in a client/server network system. A network may include a Local Area Network (LAN), Wide Area Network (WAN), Metropolitan Area Network (MAN), intranet, the Internet, etc. It is contemplated that there may be any number of devices connected via the network. A device may transfer data streams, such as streaming media data, to other devices in the network system via a number of standard and non-standard protocols.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments of the present invention may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

One or more modules, components, or elements described throughout this document, such as the ones shown within or associated with an embodiment of a DRAM enhancement mechanism may include hardware, software, and/or a combination thereof. In a case where a module includes software, the software data, instructions, and/or configuration may be provided via an article of manufacture by a machine/electronic device/hardware. An article of manufacture may include a machine accessible/readable medium having content to provide instructions, data, etc.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), EEPROM, magnet or optical cards, flash memory, or other type of media/machine-readable medium suitable for storing electronic instructions. Moreover, the present invention may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. An apparatus comprising:
   a plurality of memory cells including a plurality of data cells, a first supplemental cell and a second supplemental cell; and
   a refresh logic coupled to the plurality of memory cells, the refresh logic configured to:
      calibrate a first refresh rate, a second refresh rate slower than the first refresh rate, and a third refresh rate slower than the second refresh rate, by:
         sampling a data cell of the plurality of data cells, the first supplemental cell, and the second supplemental cell,
         calibrating the second refresh rate based on a comparison between a sampled data from the data cell to a sampled data from the first supplemental cell, and
         calibrating the third refresh rate based on a comparison between the sampled data from the data cell to a sampled data from the second supplemental cell, and
      refresh the plurality of data cells at the first refresh rate,
      refresh the first supplemental cell at the second refresh rate,
      refresh the second supplemental cell at the third refresh rate,
      increase the first refresh rate responsive to reading a first value from the first supplemental cell, the first value indicative of loss of charge in the first supplemental cell below a predetermined level, and
      decrease the first refresh rate responsive to reading a second value from the second supplemental cell, the second value indicative of retaining of charge in the second supplemental cell not below the predetermined level.

2. The apparatus of claim 1, wherein the memory device comprises a Dynamic Random Access Memory (DRAM) device.

3. The apparatus of claim 1, wherein the supplemental cells are further configured to store data responsive to one of the plurality of data cells being faulty.

4. The apparatus of claim 1, wherein the first and second supplemental cells are refreshed by storing the second value.

5. The apparatus of claim 1, wherein the first value is a logical low value, and wherein the second value is a logical high value.

6. The apparatus of claim 1, wherein each of the second refresh rate and the third refresh rate is an integer fraction of the first refresh rate.

7. The apparatus of claim 6, wherein the second refresh rate is twice the third refresh rate.

8. The apparatus of claim 1, wherein the first and second supplemental cells are distributed in columns of the plurality of memory cells.

9. The apparatus of claim 1, wherein the refresh logic is further configured to calibrate the first refresh, the second refresh rate and the third refresh rate during an initialization stage of the apparatus.

10. A system comprising:
   a processor; and
   a memory device comprising:
      a plurality of memory cells including a plurality of data cells, a first supplemental cell a second supplemental cell; and
      a refresh logic coupled to the plurality of memory cells, the refresh logic configured to:
         calibrate a first refresh rate, a second refresh rate slower than the first refresh rate, and a third refresh rate slower than the second refresh rate, by:
            sampling a data cell of the plurality of data cells, the first supplemental cell, and the second supplemental cell,
            calibrating the second refresh rate based on a comparison between a sampled data from the data cell to a sampled data from the first supplemental cell, and
            calibrating the third refresh rate based on a comparison between the sampled data from the data cell to a sampled data from the second supplemental cell,
         refresh the plurality of data cells at a first refresh rate,
         refresh the first supplemental cell at a second refresh rate slower than the first refresh rate,
         refresh the second supplemental cell at a third rate slower than the first refresh rate and the second refresh rate,
         increase the first refresh rate responsive to reading a first value from the first supplemental cell, the first value indicative of loss of charge in the first supplemental cell below a predetermined level, and
         decrease the first refresh rate responsive to reading a second value from the second supplemental cell, the second value indicative of retaining of charge in the second supplemental cell not below the predetermined level.

11. The system of claim 10, wherein the memory device comprises a Dynamic Random Access Memory (DRAM) device.

12. The system of claim 10, wherein the supplemental cells are further configured to store data responsive to one of the plurality of data cells being faulty.

13. The system of claim 10, wherein the first and second supplemental cells are refreshed by storing the second value.

14. The system of claim 10, wherein the first value is a logical low value, and wherein the second value is a logical high value.

15. The system of claim 10, wherein each of the second refresh rate and the third refresh rate is an integer fraction of the first refresh rate.

16. The system of claim 15, wherein the second refresh rate is twice the third refresh rate.

17. The system of claim 10, wherein the first and second supplemental cells are distributed in columns of the plurality of memory cells.

18. The system of claim 10, wherein the refresh logic is further configured to calibrate the first refresh, the second refresh rate and the third refresh rate during an initialization stage of the apparatus.

19. A method comprising:
   calibrating a first refresh rate, a second refresh rate slower than the first refresh rate, and a third refresh rate slower than the second refresh rate, by:
      sampling a data cell of the plurality of data cell, the first supplemental cell, and the second supplemental cell,
      calibrating the second refresh rate based on a comparison between a sampled data from the data cell to a sampled data from the first supplemental cell, and
      calibrating the third refresh rate based on a comparison between the sampled data from the data cell to a sampled data from the second supplemental cell;
   refreshing the plurality of data cells at a first refresh rate;
   refreshing a first supplemental cell at a second refresh rate slower than the first refresh rate;
   refreshing a second supplemental cell at a third rate slower than the first refresh rate and the second refresh rate;
   increasing the first refresh rate responsive to reading a first value from the first supplemental cell, the first value indicative of loss of charge in the first supplemental cell below a predetermined level; and
   decreasing the first refresh rate responsive to reading a second value from the second supplemental cell, the second value indicative of retaining of charge in the second supplemental cell not below the predetermine level.

20. The method of claim 19, wherein the first and second supplemental cells are refreshed by storing the second value, wherein the first value is a logical low value, and wherein the second value is a logical high value.

21. The method of claim 19, wherein each of the second refresh rate and the third refresh rate is an integer fraction of the first refresh rate.

22. The method of claim 19, wherein the second refresh rate is twice the third refresh rate.

23. The method of claim 19, further comprising calibrating the first refresh rate, the second refresh rate and the third refresh rate during an initialization stage of the plurality of memory cells.

* * * * *